United States Patent
Toko et al.

(10) Patent No.: US 9,042,166 B2
(45) Date of Patent: May 26, 2015

(54) MAGNETORESISTIVE EFFECT ELEMENT AND METHOD OF MANUFACTURING MAGNETORESISTIVE EFFECT ELEMENT

(71) Applicant: KABUSHIKI KAISHA TOSHIBA, Tokyo (JP)

(72) Inventors: Masaru Toko, Tokyo (JP); Tatsuya Kishi, Kanagawa (JP); Akiyuki Murayama, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,374

(22) Filed: Aug. 30, 2013

(65) Prior Publication Data

US 2014/0284736 A1    Sep. 25, 2014

(30) Foreign Application Priority Data

Mar. 22, 2013 (JP) .................... 2013-060724

(51) Int. Cl.
  G11C 11/00 (2006.01)
  H01L 43/08 (2006.01)
  H01L 43/12 (2006.01)
  H01L 43/02 (2006.01)
(52) U.S. Cl.
  CPC ............... *H01L 43/08* (2013.01); *H01L 43/12* (2013.01); *H01L 43/02* (2013.01)
(58) Field of Classification Search
  CPC ....................... H01L 27/222; H01L 27/224
  USPC ........... 257/108, E43.001, E43.005, E43.006, 257/E27.006, E29.167, E21.665
  See application file for complete search history.

(56) References Cited

U.S. PATENT DOCUMENTS

| | | | |
|---|---|---|---|
| 7,919,826 B2 | 4/2011 | Iwayama et al. | |
| 2004/0135184 A1* | 7/2004 | Motoyoshi | 257/295 |
| 2006/0187705 A1 | 8/2006 | Nakamura et al. | |
| 2007/0187785 A1* | 8/2007 | Hung et al. | 257/421 |
| 2007/0195592 A1 | 8/2007 | Yuasa | |
| 2007/0258170 A1 | 11/2007 | Yuasa | |
| 2009/0080123 A1 | 3/2009 | Uehara et al. | |
| 2009/0091863 A1 | 4/2009 | Hosotani et al. | |
| 2010/0020592 A1 | 1/2010 | Hosotani et al. | |
| 2010/0276768 A1* | 11/2010 | Gaidis | 257/421 |
| 2010/0315869 A1* | 12/2010 | Min et al. | 365/171 |
| 2012/0032288 A1 | 2/2012 | Tomioka | |

FOREIGN PATENT DOCUMENTS

| | | |
|---|---|---|
| JP | 2008-218829 | 9/2008 |
| JP | 2008-294420 A | 12/2008 |
| JP | 2010-097977 | 4/2010 |
| JP | 2010-147213 | 7/2010 |
| JP | 2013-060724 | 4/2013 |

\* cited by examiner

*Primary Examiner* — Eduardo A Rodela
(74) *Attorney, Agent, or Firm* — Patterson & Sheridan, LLP

(57) ABSTRACT

A magnetoresistive effect element includes first and second conductive layers, a first magnetic layer between the first and second conductive layers having a magnetization direction that is unchangeable, a second magnetic layer between the first and second conductive layers having a magnetization direction that is changeable, a tunnel barrier layer between the first and second magnetic layers, a nonmagnetic layer between the second magnetic layer and the second conductive layer, and a conductive sidewall film that provides a current path between the second magnetic layer and the second conductive layer that has a lower resistance than a current path through the nonmagnetic layer.

8 Claims, 14 Drawing Sheets

COLUMN DIRECTION

MAGNETORESISTIVE EFFECT ELEMENT AND METHOD OF MANUFACTURING MAGNETORESISTIVE EFFECT ELEMENT

CROSS-REFERENCE TO RELATED APPLICATION

This application is based upon and claims the benefit of priority from Japanese Patent Application No. 2013-060724, filed Mar. 22, 2013, the entire contents of which are incorporated herein by reference.

FIELD

Embodiments described herein relate generally to a magnetoresistive effect element and a method of manufacturing a magnetoresistive effect element.

BACKGROUND

Various technologies have been proposed to realize magnetic memory that uses a tunnel magnetoresistive element (TMR).

Spin injection magnetization reversal type magnetic memory (for example, STT-MRAM) has been under development, which is memory in which low electric power consumption, high speed operation, and large capacity are possible.

For writing of data by STT to the magnetic memory, magnetization of a magnetic film of an MTJ element is reversed and a resistance state of the magnetoresistive effect element changes, by supplying the MTJ element with write electric current. Data "1" or "0" is stored in the magnetoresistive effect element in such a manner as to correspond to the resistance state of the magnetoresistive effect element.

Reading of the data from the magnetic memory is executed by supplying the magnetoresistive effect element with read electric current and discriminating a difference in a resistance value of the magnetoresistive effect element due to a TMR effect.

DETAILED DESCRIPTION

Figure 1:
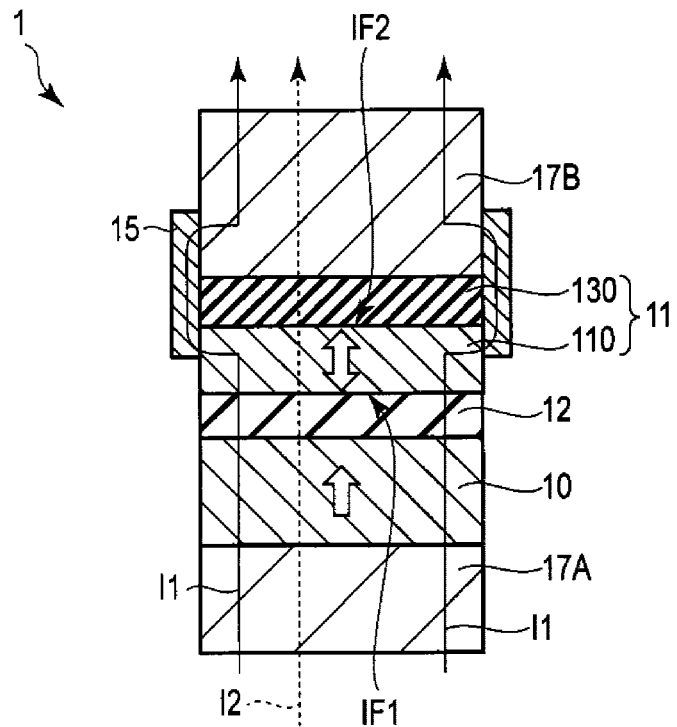
FIG. 1 is a view illustrating a basic configuration of a magnetoresistive effect element according to an embodiment.

Embodiments provide a technology that improves characteristics of a magnetoresistive effect element.

In general, a magnetoresistive effect element according to one embodiment, includes first and second conductive layers, a first magnetic layer between the first and second conductive layers having a magnetization direction that is unchangeable, a second magnetic layer between the first and second conductive layers having a magnetization direction that is changeable, a tunnel barrier layer between the first and second magnetic layers, a nonmagnetic layer between the second magnetic layer and the second conductive layer, and a conductive sidewall film that provides a current path between the second magnetic layer and the second conductive layer that has a lower resistance than a current path through the nonmagnetic layer.

Embodiments

The present embodiments are described in detail below referring to the drawings. In the following description, elements having the same function and configuration are given like reference numerals, and overlapping descriptions are provided whenever necessary.

A. Basic Configuration

A basic configuration of the magnetoresistive effect element according to the embodiment is described referring to FIG. 1.

FIG. 1 is a cross-sectional view illustrating the basic configuration of the magnetoresistive effect element.

The magnetoresistive effect element in FIG. 1 includes a first magnetic layer 10 of which magnetization is unchangeable indirection (in a fixed state), a second magnetic layer 11 of which magnetization is changeable in direction, and a nonmagnetic layer 12 between the two magnetic layers 10 and 11.

A magnetic tunneling junction is formed from the two magnetic layers 10 and 11 and the nonmagnetic layer 12.

The first magnetic layer 10 of which the magnetization is constant in direction is hereinafter also referred to as a reference layer 10. The second magnetic layer 11 of which the magnetization is changeable in direction is also referred to as a storage layer 11. Furthermore, the nonmagnetic layer 12 is also referred to as a tunnel barrier layer 12.

Both magnetic layers 10 and 11 each have magnetic anisotropy in the vertical direction with respect to film surfaces of the magnetic layers 10 and 11. The magnetization of the both magnetic layers 10 and 11 is in the vertical direction with respect to the film surfaces. The magnetic layer (the magnetic material and the magnetization film) of which the magnetization is in the vertical direction with respect to the film surface of the layer (the film) is hereinafter referred to as a vertical magnetization film.

According to the present embodiment, the storage layer 11 includes one magnetization film 110 and one nonmagnetic film 130.

The nonmagnetic film 130 in the storage layer 11 is interposed between an electrode 17B and the magnetization film 110.

The magnetoresistive effect element according to the present embodiment has a configuration in which the magnetization film 110 of the storage layer 11 is interposed between the two nonmagnetic layers 12 and 130.

A combination of a material of the magnetization film 110 and materials of the nonmagnetic layers 12 and 130 is set in such a manner that the magnetic anisotropy (for example, interface magnetic anisotropy) of the magnetization film 110 develops between the nonmagnetic layers 12 and 130 and the magnetization film 110.

The nonmagnetic layers 12 and 130 are provided in such a manner as to come into contact with a first surface IF1 of the magnetization film 11, which faces toward the reference layer 10, and a second surface IF2, opposite the first surface IF1 of the magnetization film 11, respectively. Accordingly, the interface magnetic anisotropy develops on each of the first and second surfaces IF1 and IF2 of the magnetization film in the lamination direction of the magnetic layer (the magnetic tunneling junction).

As a result, vertical magnetic anisotropy of the magnetization film 110 is improved by applying interface magnetic anisotropy energy from both of the surfaces of the magnetization film 110, which face each other, when compared to a case where the interface magnetic anisotropy between the magnetization film 110 and the nonmagnetic layer is formed only on one surface of the magnetization film 110. Accordingly, a thermal agitation constant ($\Delta E$) of the storage layer 11 can be improved.

The nonmagnetic film 130 in contact with the magnetization film 110, which is on the other side of the magnetization film 110 from the tunnel barrier layer 12, is hereinafter also referred to as an anisotropy assignment film 130. For example, the same material as in the nonmagnetic layer 12 is used for the anisotropy assignment film 130. For example, if the magnetization film is a film that includes at least two of cobalt (Co), iron (Fe) and boron (B), for example, a film with insulation or with high resistance, such as magnesium oxide (MgO), is used as the anisotropy assignment film 130 and the tunnel barrier layer 12.

Moreover, according to the present embodiment, the anisotropy assignment film 130 is described as one part of the storage layer 11, but the anisotropy assignment film 130 may be regarded as a separate constituent element from the storage layer 11.

In the magnetoresistive effect element 1 according to the present embodiment, a sidewall film 15 is provided on a lateral side of the storage layer 11 in such a manner as to straddle the interface IF2 between the magnetization film 110 and the anisotropy assignment film 130 in the storage layer 11. Furthermore, the sidewall film 15 straddles an interface between the anisotropy assignment film 130 and a conductive layer (an electrode) 17B, and the sidewall film 15 is provided on a lateral side of the conductive layer 17B. Metal is used for the sidewall film 15. The sidewall film 15 has a lower resistance value than the anisotropy assignment film 130. When electric current is supplied to the magnetoresistive effect element 1, the supplied electric current flows through the sidewall film (the conductive layer) 15. The sidewall film 15 is hereinafter also referred to as the sidewall conductive film 15, the conductive layer 15, or an electric current path film 15.

The sidewall film 15 as the electric current path is not provided on lateral sides of the tunnel barrier layer 12 and the reference layer 10. The sidewall film 15 does not straddle an interface IF1 between the storage layer 11 and the tunnel barrier layer 12. Furthermore, the sidewall film 15 does not straddle an interface between the tunnel barrier layer 12 and the reference layer.

If the magnetoresistive effect element 1 is used as a memory element, in order to change the magnetization direction of the storage layer 11, write electric current is supplied to the magnetoresistive effect element. Furthermore, in order to discriminate the resistance value of the magnetoresistive effect element 1 as the memory element, read electric current is supplied to the magnetoresistive effect element.

The resistance value of the sidewall film 15 is smaller than a resistance value of the anisotropy assignment film 130 and a resistance value (an interface resistance, or a tunneling junction resistance) between the magnetization film 110 and the anisotropy assignment film 130. For that reason, most of the electric current I1 of the write electric current and the read electric current flows through the sidewall film (the electric current path film) 15 on the lateral side of the storage layer 11, and flows between the storage layer 11 and the reference layer 12 via the interface IF1 between the storage layer 11 and the tunnel barrier layer 12. Electric current I2 flowing through the interface IF2 between the magnetization film 110 and the anisotropy assignment film 130 is smaller than the electric current I1 flowing through the sidewall film 15 on the lateral side of the storage layer 11.

The sidewall film 15 becomes the electric current path that connects between the magnetization film 110 and the conductive layer 17B. The electric current flowing through the storage layer 11 detours around the anisotropy assignment film 130 and flows between the magnetization film 110 and the conductive layer 17B. For that reason, when the electric current flows through the magnetoresistive effect element 1, a loss of the electric current, caused by the anisotropy assignment film 130 that is comparatively high in resistance, is reduced.

As described above, in the magnetoresistive effect element 1 according to the present embodiment, the nonmagnetic layer (an insulation film) that forms the anisotropy assignment film 130 contributes to improving the magnetic anisotropy of the magnetization film 110. On the one hand, in the magnetoresistive effect element 1 according to the present embodiment, a resistance component of the anisotropy assignment film 130 can be almost ignored due to the sidewall conductive film 15 that connects electrically the storage layer 11 to the conductive layer 17B, and adverse effects of electrical characteristics (for example, an MR ratio) of the magnetoresistive effect element that are caused by the anisotropy assignment film 130 that is high in resistance do not occur.

Therefore, in the magnetoresistive effect element according to the embodiment, characteristics of the magnetoresistive effect element can be improved.

B. First Embodiment

A magnetoresistive effect element according to a first embodiment and a method of manufacturing the magnetoresistive effect element are described referring to FIGS. 2 to 6.

a. Configuraton

Figure 2:
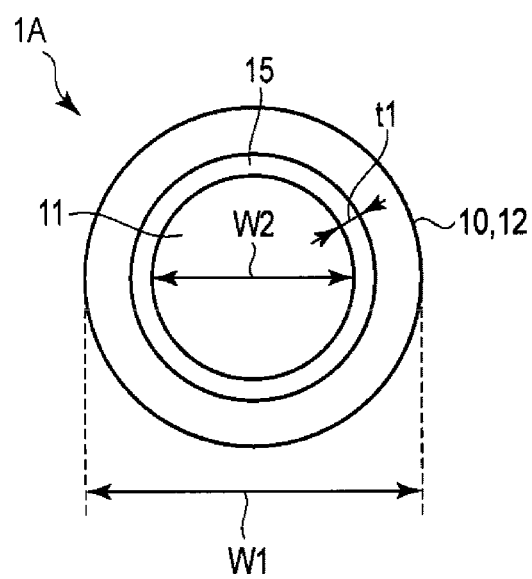
FIG. 2 is a view illustrating a configuration of the magnetoresistive effect element according to a first embodiment.
Figure 3:
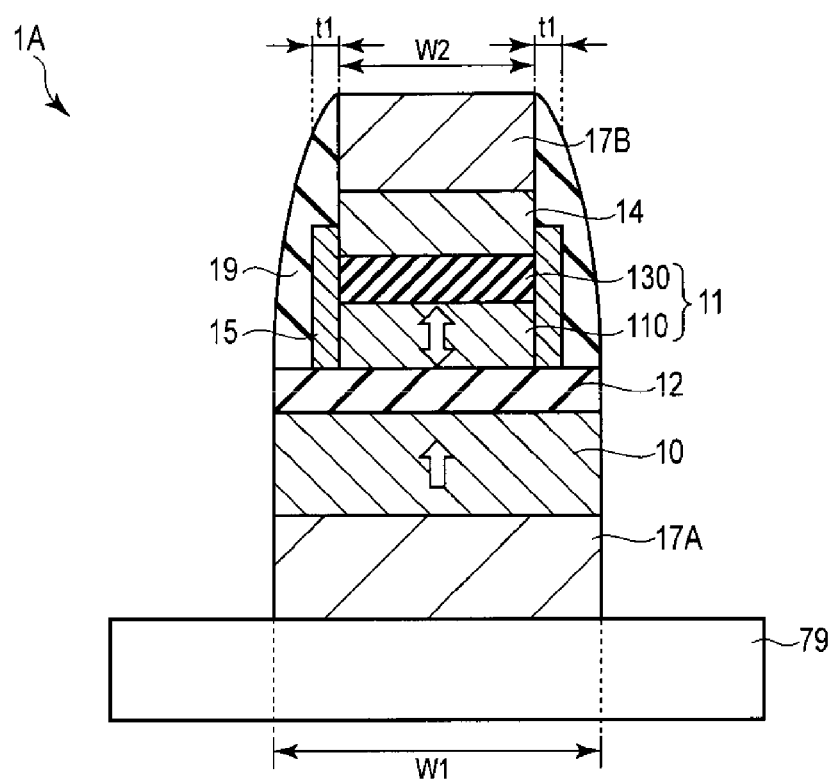
FIG. 3 is a view illustrating the configuration of the magnetoresistive effect element according to the first embodiment.

A configuration of the magnetoresistive effect element according to the first embodiment is described referring to FIG. 2 and FIG. 3.

FIG. 2 is a plan view schematically illustrating a planar configuration of the magnetoresistive effect element according to the first embodiment.

FIG. 3 is a cross-sectional view schematically illustrating a cross-sectional configuration of the magnetoresistive effect element of the first embodiment.

As illustrated in FIG. 2, a magnetoresistive effect element 1A has a circular or elliptical planar shape. Each of the magnetic layers 10 and 11 and the nonmagnetic layer 12 of the magnetoresistive effect element 1A has a circular (or, elliptical) planar shape with a certain diameter.

As illustrated in FIG. 3, the magnetoresistive effect element according to the present embodiment includes two magnetic layers 10 and 11 as a reference layer and a storage layer, respectively, between two electrodes 17A and 17B in the element 1A. Moreover, the reference layer 10 is also referred to as a pin layer, a magnetization-unchangeable layer, or a magnetization-fixed layer. A storage layer 11 is also referred to as a storage layer, a free layer, or a magnetization-changeable layer.

The magnetization of the storage layer 11 and the reference layer 10 is formed by a gathering of multiple spins (magnetization of magnetic grains) in the storage layer 11 and the reference layer 10.

In the storage layer 11, the magnetization direction can be reversed. The magnetization direction of the reference layer 10 is in a fixed state. Even though the electric current that changes the magnetization direction of the storage layer 11 is supplied, a magnetization reversal threshold value of the reference layer 10 is greater than a magnetization reversal threshold value of the storage layer 11 such that the magnetization direction of the reference layer 10 is not changed.

If the MTJ element 1A according to the present embodiment is used for the memory element of the magnetic memory, during data writing based on a spin injection magnetization reversal type (Spin Transfer Torque, hereinafter referred to as STT), an electric current, the value of which is equal to or greater than the magnetization reversal threshold value of the storage layer 11 and equal to or smaller than the magnetization reversal threshold value of the reference layer 10, is supplied to the MTJ element 1A, and thus relative magnetization directions of the storage layer 11 and the reference layer 10 are reversed.

In STT, the magnetization direction of the storage layer 11 of the MTJ element 1A is changed by a spin torque caused by the electric current that flows through the MTJ element 1A. That is, electrons that are spin-polarized and contained in the electric current supplied to the MTJ element 1A, act on the magnetization (the spin) of the storage layer 11, thereby changing the magnetization direction of the storage layer 11.

If the magnetization direction of the storage layer 11 is in a state of being parallel (P) with the magnetization direction of the reference layer 10, that is, if the magnetization direction of the storage layer 11 is in the same as the magnetization direction of the reference layer 10, the electric current that flows from the storage layer 11 to the reference layer 10 is supplied as the write electric current to the MTJ element 1A.

If the magnetization direction of the storage layer 11 is in a state of being anti-parallel (AP) with the magnetization direction of the reference layer 10, that is, if the magnetization direction of the storage layer 11 is opposite the magnetization direction of the reference layer 10, the electric current that flows from the reference layer 10 to the storage layer 11 is supplied as the write electric current to the MTJ element 1A.

For example, in the MTJ element 1A as the memory element, for example, the MTJ element 1A that is in a state where a resistance value is small (in a state where magnetization arrangements are parallel) is matched to a state of holding data "0," and the MTJ element 1A that is in a state where the resistance value is great (in a state where the magnetization arrangements are anti-parallel) is matched to a state of holding data "1."

The reading of the data from the MTJ element 1A as the memory element is executed by discriminating a resistance state of the MTJ element. If the resistance state of the MTJ element 1A is discriminated, by causing the electric current to flow through the MTJ element 1A, it is determined whether the MTJ element 1A is in the state of holding the data "0," or is in the state of holding the data "1."

A size of a signal (a read output and a read signal), based on the electric current (hereinafter referred to as read electric current or resistance discrimination electric current) for discriminating the resistance state, which flows through the MTJ element 1A, changes depending on the resistance value of the MTJ element 1A. An electric current value of the read electric current is set to a value that is smaller than an electric current value (the magnetization reversal threshold value) of the write electric current, in such a manner that the magnetization of the storage layer 11 is not reversed by the read electric current.

In this manner, if the MTJ element 1A is used for the memory element of the magnetic memory, by causing the electric current to flow through the MTJ element 1A, the data is written to the MTJ element as the memory element, and the data stored in the MTJ element as the memory element is read.

The reference layer 10, a tunnel barrier layer 12 and the storage layer 11 are laminated on a substrate 79.

According to the present embodiment, the storage layer 11 is laminated over the reference layer 10 with the tunnel barrier layer 12 in between. As in the magnetoresistive effect element according to the present embodiment, the configuration in which the storage layer 11 is laminated over the reference layer 10 is referred to as a top free type configuration (or, a bottom pin type configuration).

The reference layer 10, the tunnel barrier layer 12 and the storage layer 11 form a magnetic tunneling junction. The magnetoresistive effect element 1A including the magnetic tunneling junction is hereinafter referred to as the MTJ element 1A.

A lamination configuration in which the MTJ element 1A is formed is interposed between two electrodes 17A and 17B in the lamination direction.

In the direction of the substrate, the reference layer 10 is provided on the electrode (hereinafter referred to as a lower electrode) 17A on the substrate 79. In the opposite direction of the substrate, the electrode (hereinafter referred to as an upper electrode) 17B is provided over the storage layer 11. The storage layer 11 is provided between the tunnel barrier layer 12 and the upper electrode 17B.

The vertical magnetic anisotropy of the storage layer 11 of the MTJ element 1A is developed by using the interface magnetic anisotropy of the magnetic film. The interface magnetic anisotropy is caused by a distortion in an interface between lamination films, or an electronic state of the interface. If the vertical magnetic anisotropy of the magnetic layers 11 and 12 is formed by the interface magnetic anisotropy, dispersion of crystalline axes of the magnetic layer can be suppressed.

By using the film, of which a main component is MgO, for the tunnel barrier layer (the nonmagnetic layer) 12, and using FeB or CoFeB for the storage layer 11 (the magnetization film 110), the interface magnetic anisotropy occurs between MgO and FeB, or between MgO and CoFeB, and the storage layer 11 is obtained that has the magnetic anisotropy in the vertical direction with respect to the film surface. Because the vertical magnetic anisotropy of the storage layer 11 develops between the nonmagnetic layer 12 and the storage layer 11, the dispersion of the anisotropy of magnetization can be suppressed, and an increase in the reversal threshold value electric current of the storage layer 11 is suppressed.

Moreover, the vertical magnetization film that uses the intersurface magnetic anisotropy, for example, can be formed by an artificial lattice. For example, the artificial lattice is exemplified in which a magnetic material, Co and a nonmagnetic material, Pt (or Pd) are alternately laminated.

If the data writing with respect to the MTJ element 1A as the memory element that uses STT is considered, it is preferable to form the storage layer 11 by using a material of which a damping constant is small.

The tunnel barrier layer (the nonmagnetic film) 12 is formed from a film of which a main component is magnesium oxide (MgO). It is preferable that the film of which the main component is MgO, as the tunnel barrier layer 11, be crystalline-oriented. It is preferable that the film of crystalline MgO, for example, should take precedence in orientation over a bcc (001) surface (or, azimuth) or a surface (or, azimuth) equivalent to that.

For example, in order to form the reference layer 10 having the vertical magnetic anisotropy, for example, a film of which the main component is a ferromagnetic material such as TbCoFe, a film of which the main components are Co and Fe, an artificial lattice of Co and Pt, an artificial lattice of Co and Pd, or the like is used for the reference layer 10.

Moreover, an interface layer may be provided in the vicinity of the interface between the storage layer 11 and the tunnel barrier layer 12, and in the vicinity of the interface between the reference layer 10 and the tunnel barrier layer 12. The interface layer is a magnetic film in contact with the tunnel barrier layer 12. The interface layer relaxes a lattice mismatch between the tunnel barrier layer and the magnetic layer and improves crystallinity of each of the tunnel barrier layer 12 and the magnetic layers 10 and 11. As a result, characteristics (for example, the MR ratio) of the MTJ element are improved.

There is a case where not only the magnetic film that is provided separately from the storage layer 11 and the reference layer 10, but also the storage layer 11 or a portion (a region) of the reference layer 10 that is in contact with the tunnel barrier layer 12 is referred to as the interface layer. For example, the interface layer is formed by using a magnetic film including at least two elements selected from a group including cobalt (Co), iron (Fe) and boron (B). With regard to a film of CoFeB as the interface layer that faces toward the storage layer 11, and the film of CoFeB as the interface layer that faces toward the reference layer, a composition ratio of Co, Fe and B may be different in the two interface layers from each other. A material of the interface layer is not limited to the magnetic film including Co, Fe or B.

The MTJ element 1A may include a shift adjustment layer (not illustrated) that has the magnetization in the direction opposite the magnetization direction of the reference layer 10. The shift adjustment layer (referred to as a bias layer or a shift magnetic field adjustment layer) reduces a leak magnetic field caused by the reference layer 10 to a substantially zero level, and suppresses an occurrence of a shift magnetic field in the storage layer 11, caused by the leak magnetic field from the reference layer 10. For example, the shift adjustment layer is provided in the opposite direction (on the opposite surface) to the surface of the reference layer 10 on which the tunnel barrier layer 12 is provided.

The upper electrode 17B of the MTJ element 1A may be used as a hard mask for processing the MTJ element 1A into a predetermined shape. The lower electrode 17A may function as a base layer that improves the crystallinity of the magnetic layer (here, the reference layer).

For example, tantalum (Ta), titanium (Ti), tantalum nitride (TaN), titanium nitride (TiN), or a film in which these are laminated is used for the lower electrode 17A and the upper electrode 17B. Ir or ruthenium (Ru) may be used for the lower electrode 17A. It is preferable that each of the lower electrode 17A and the upper electrode 17B be a material that is low in resistance value, and prevents diffusion of impurities.

For example, a cap layer 14 is provided between the storage layer 11 and the upper electrode 17B in the MTJ element 1A. The cap layer 14 prevents the diffusion of the impurities between the storage layer 11 and the upper electrode 17B. Furthermore, the cap layer 14 has a function of improving the crystallinity of the storage layer 11. It is preferable that a material, which can reduce spin pumping that occurs between the storage layer 11 and the upper electrode 17B and which can decrease the damping constant of the storage layer 11, be used for the cap layer 14. The reduction of the damping constant of the storage layer 11 can reduce the write electric current. Moreover, the cap layer 14 may be treated as one part of the upper electrode 17B.

According to the present embodiment, a dimension W1 of the reference layer 10 (a diameter of the reference layer 10) in the direction parallel with a surface of the substrate is greater than a dimension W2 of the storage layer 11 (a diameter of the storage layer 11) in the direction parallel with the surface of the substrate. A dimension of the tunnel barrier layer 12 in the direction parallel with the surface of the substrate is substantially the same as the dimension W1 of the reference layer 10. The dimension of the tunnel barrier layer 12 in the direction parallel with the surface of the substrate is greater than the dimension W2 of the storage layer 11. The dimension of the tunnel barrier layer 12 in the direction parallel with the surface of the substrate is described below as being the same as the dimension W1 of the reference layer 10 in the direction parallel with the surface of the substrate.

A sidewall insulation film 19 is provided on lateral sides of the storage layer 11, the cap layer 14 and the upper electrode 17B. A dense, conformal film is preferably used for the sidewall insulation film 19, and, for example, silicon nitride, aluminum nitride, or the like is used for the sidewall insulation film 19. Moreover, the sidewall insulation film 19 may be provided on lateral sides of the lower electrode 17A, the reference layer 10 and the tunnel barrier layer 12.

In the MTJ element (the magnetoresistive effect element) 1A according to the present embodiment, the storage layer 11 includes the magnetization film 110 and the anisotropy assignment film 130.

The same material as in the tunnel barrier layer 12 is used for the anisotropy assignment film 130, and, for example, a film of which a main component is MgO is used. It is preferable that the resistance value of the anisotropy assignment film 130 be lower than the resistance value of the tunnel barrier layer 12. If the anisotropy assignment film 130 and the tunnel barrier layer 12 are formed from the same material (for example, MgO), in order to have the resistance value of the anisotropy assignment film 130 be lower than the resistance value of the tunnel barrier layer 12, it is preferable that a film thickness of the anisotropy assignment film 130 be smaller than a film thickness of the tunnel barrier layer 12. However, if in order to improve interface anisotropic energy of the magnetic material, it is preferable to use the anisotropy assignment film (MgO) that is good in film quality, the film thickness of the anisotropy assignment film 130 may be greater than the film thickness of the tunnel barrier layer 12.

If the MgO film is used for the anisotropy assignment film 130 and the tunnel barrier layer 12, for example, CoFeB is used for the magnetization film 110.

The magnetization film 110 has the magnetic anisotropy in the direction vertical to the film surface thereof, by using the interface magnetic anisotropy that the contact of the magnetization film 110 with the tunnel barrier layer 12 and the anisotropy assignment film 130 causes to be developed.

The interface magnetic anisotropy energy $K_{total}$ of the magnetic layer is expressed by $K_{total}=K_s \times S - 2\pi Ms2(3Na-1)$. "Ks" in the expression indicates the interface magnetic anisotropy constant, and "S" indicates an area of the magnetic layer. "Ms" in the expression indicates saturation magnetization, and "Na" indicates a demagnetization factor.

The thermal agitation constant (a thermal stability index) $\Delta E$ of the magnetic layer is expressed by $\Delta E = K_{total}/(k_B T)$. "$k_B$" in the expression indicates the Boltzmann constant, and "T" indicates a temperature (an absolute temperature). Because when based on a relationship between $\Delta E$ and $K_{total}$, making the element smaller entails a decrease in an area S of the storage layer (the dimension of the storage layer in the direction parallel with the surface of the substrate), and the interface magnetic anisotropy, which is given to the storage layer, tends to decrease.

According to the present embodiment, the tunnel barrier layer 12 and the anisotropy assignment film 130 cause the interface magnetic anisotropy to develop in two surfaces, which face each other, which the magnetization film 110 has in the direction vertical to the surface of the substrate (in the lamination direction of the layer). In this case, because when based on the interface magnetic anisotropy energy $K_{total}$ described above, the result is equivalent to two times the value the interface magnetic anisotropy energy of the magnetization film 110 in the storage layer 11 is increased and the vertical magnetic anisotropy of the magnetization film 110 is improved.

As a result, in the MTJ element 1A according to the present embodiment, the thermal agitation constant of the magnetization film 110 in the storage layer 11 is improved, and the thermal stability in operation of the magnetoresistive effect element is improved.

In the MTJ element 1A according to the present embodiment, the sidewall film (the sidewall conductive film, and the electric current path film) 15 with conductivity is provided on lateral sides of the storage layer 11 and the conductive layer 14 that is laminated on the upper surface of the storage layer 11 and the conductive layer 17B on the conductive layer 14. The sidewall conductive film 15 is provided between the storage layer 11 and the sidewall insulation film 19. The sidewall conductive film 15, for example, has a cylindrical shape that covers the lateral side of the column-shaped storage layer 11.

The resistance value of the sidewall conductive film 15 is lower than the resistance value of the anisotropy assignment film 130. Metal is used for the sidewall conductive film 15, and the sidewall conductive film 15 is made from substantially the same material as the magnetization film 110. Moreover, if the sidewall conductive film 15 is a film of which a main component is the same element as a main component of the magnetization film 110, a composition ratio of each element in the sidewall conductive film 15 and a composition ratio of each element in the magnetization film 110 may be different from each other. Furthermore, the sidewall conductive film 15 may include a metallic element that the tunnel barrier layer 12 includes.

The sidewall conductive film 15 is provided on the lateral side of the storage layer 11, in such a manner as to straddle the interface between the magnetization film 110 and the anisotropy assignment film 130 in the storage layer 11. The sidewall conductive film 15 comes into direct contact with the lateral side of the magnetization film 110. The sidewall conductive film 15 is provided on the lateral side of the cap layer 14, in such a manner as to straddle the interface between the anisotropy assignment film 130 and the cap layer 14. The sidewall conductive film 15 comes into direct contact with the lateral side of the cap layer 14. The sidewall conductive film 15 straddles the lateral side of the anisotropy assignment film 130 and extends along the lateral side of the magnetization film 110 of the storage layer 11 and the lateral side of the cap layer 14.

Moreover, the sidewall conductive film 15 may be provided on a lateral side of the upper electrode 17B in succession to the lateral side of the storage layer 11 and the cap layer 14. The sidewall conductive film 15 may not be uniformly formed over the entire lateral side of the storage layer 11. When the magnetization film 110 is electrically connected to the cap layer 14 (the upper electrode 17B) by the sidewall conductive film 15, the sidewall conductive film 15 may be provided on the magnetization layer 110 and one part of the cap layer 14 in such a manner as to extend along the magnetization film 110 and the cap layer 14.

The surface of the sidewall conductive film 15, which is not in contact with the storage layer 11 and the cap layer 14, is covered with the sidewall insulation film 19.

For example, an end portion (a lower end) of the conductive layer 15, which faces toward the lower electrode (faces toward the substrate) is in contact with the tunnel barrier layer 12. An end portion (an upper end) of the conductive layer 15, which faces toward the upper electrode (the opposite side of the substrate) is positioned closer to the upper electrode than the interface between the anisotropy assignment film 130 and the cap layer 14 in the direction vertical to the surface of the substrate.

A sum value (W2+2×t1) of twice the dimension (the film thickness) t1 of the sidewall conductive film 15 and the dimension W2 of the storage layer 11 in the direction parallel to the surface of the substrate is smaller than the dimension W1 of the tunnel barrier layer 12 (the reference layer 10). Accordingly, the sidewall conductive film. 15 is prevented from coming into contact with the lateral sides of the tunnel barrier layer 12 and the reference layer 10. Therefore, the sidewall conductive film 15 can be prevented from being an electric current path between the storage layer 11 and the reference layer 10.

In the MTJ element 1A according to the present embodiment, the cap layer 14 and the magnetization film 110 are electrically connected through the sidewall conductive film 15. Accordingly, the electric current path, which does not include the anisotropy assignment film (the MgO film), is formed between the cap layer 14 and the magnetization film 110 (between the upper electrode 17B and the magnetization film 110).

When the write electric current or the read electric current is supplied to the MTJ element 1A according to the present embodiment, as described referring to FIG. 1, most of the electric current supplied to the MTJ element 1A flows through the sidewall conductive film 15 of low resistance and then flows between the magnetization film 110 and the cap layer (and the upper electrode) 14. The electric current that flows through the interface between the anisotropy assignment film 130 of high resistance and the magnetization film 110 is almost not present, or extremely small, when compared to the electric current that flows through the conductive layer 15.

As a result, even though the anisotropy assignment film 130 that is made from the material with high resistance (or, with insulation) to improve the vertical magnetic anisotropy of the storage layer 11 (the magnetization film 110) is provided in the MTJ element 1A in such a manner as to come into contact with the magnetization film 110, a decrease in the electric current is suppressed that is caused by that anisotropy assignment film 130.

Furthermore, because parasitic resistance that occurs between the anisotropy assignment film 130 and the magnetization film 110 can be substantially ignored with the sidewall conductive film 15, deterioration in the MR ratio of the MTJ element 1A that is caused by that parasitic resistance can be suppressed. Furthermore, because the electric current path that does not include the anisotropy assignment film 130 is formed in the MTJ element 1A with the sidewall conductive film 15, the film thickness of the anisotropy assignment film (the MgO film) 130 can be increased, and the film quality of the anisotropy assignment film 130 for applying the interface magnetic anisotropy to the magnetization film 110 can be improved.

As described above, the MTJ element 1A according to the present embodiment can improve the vertical magnetic anisotropy and the thermal stability of the storage layer 11 with the anisotropy assignment film. 130 that is in contact with the magnetization film 110 in the storage layer 11. Along with this, the MTJ element 1A according to the present embodiment can suppress the increase in the write electric current and the read electric current for operating the MTJ element, caused by the anisotropy assignment film 130, by electrically making a direct connection between the magnetization film 110 and the conductive layer 14 that interpose the anisotropy assignment film 130 between them, and the conductive layer 17B, with the sidewall conductive film 150.

As described above, the magnetoresistive effect element according to the first embodiment can improve the characteristics of the element.

b. Manufacturing Method

Figure 4:
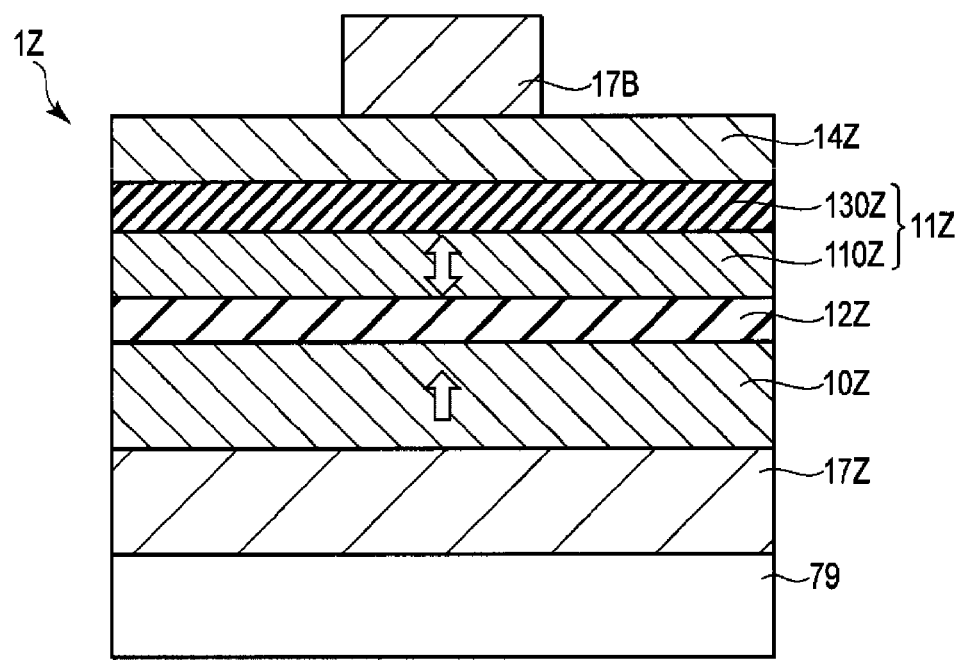
FIG. 4 is a cross-sectional view illustrating a method of manufacturing the magnetoresistive effect element according to the first embodiment.
Figure 5:
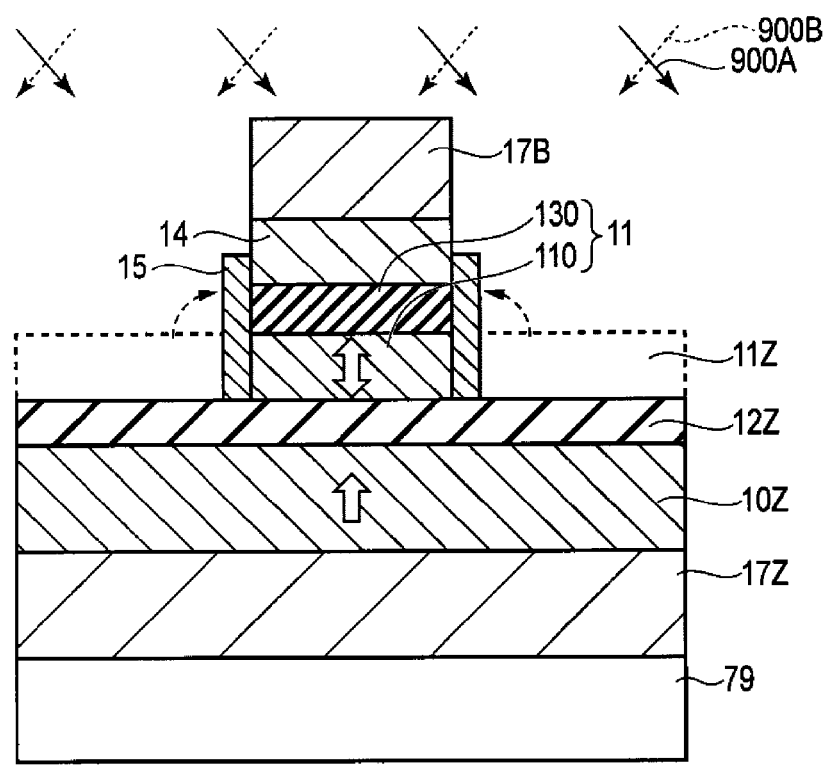
FIG. 5 is a cross-sectional view illustrating the method of manufacturing the magnetoresistive effect element according to the first embodiment.
Figure 6:
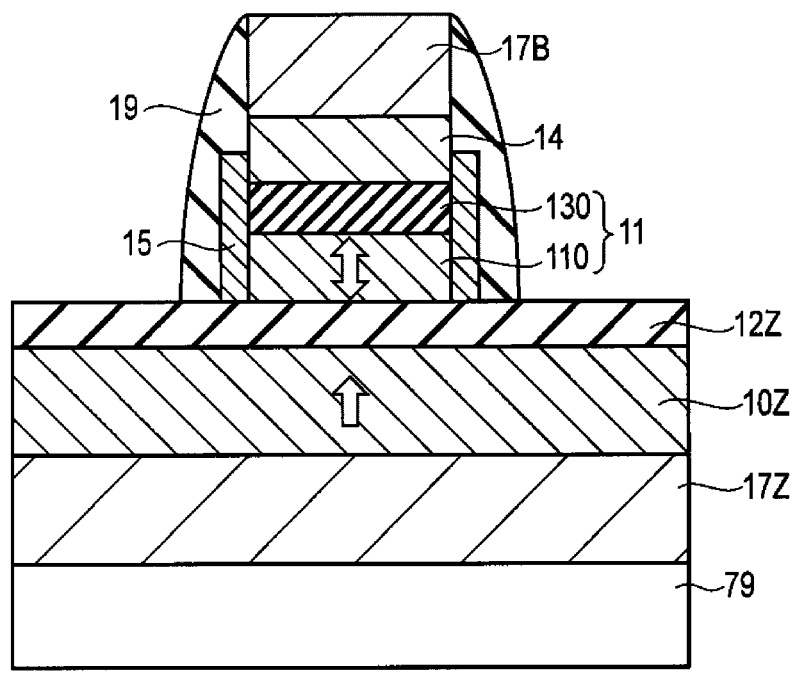
FIG. 6 is a cross-sectional view illustrating the method of manufacturing the magnetoresistive effect element according to the first embodiment.

The method of manufacturing the magnetoresistive effect element according to the first embodiment is described referring to FIG. 4 to FIG. 6.

FIG. 4 to FIG. 6 are cross-sectional views, each illustrating process in the method of manufacturing the magnetoresistive effect element according to the first embodiment.

As illustrated in FIG. 4, as constituent members of the magnetoresistive effect element (the MTJ element), a conductive layer 17Z, a magnetic layer 10Z, a nonmagnetic layer 12Z, a magnetization film 110Z and a nonmagnetic film 130Z, a cap layer 14Z and a hard mask 17B are sequentially laminated on the substrate 79 by using a sputtering technique. The substrate 79, for example, is an insulation film on a silicon substrate (for example, an interlayer insulation film).

The conductive layer 17Z is a layer that becomes a lower electrode and a base layer. For example, Ta is used for the conductive layer 17Z. The magnetic layer 10Z is a layer that becomes a reference layer. The ferromagnetic material (for example, TbCoFe) or the like is used for the magnetic layer 10Z as the reference layer. The nonmagnetic layer 12Z is a layer that becomes a tunnel barrier layer. For example, MgO, or a compound of which a main component is MgO is used for the nonmagnetic layer 12Z as the tunnel barrier layer.

According to the present embodiment, the magnetization film 110Z and the nonmagnetic layer 130Z are layers that become the storage layer. A magnetic alloy (for example, CoFeB) including at least one of Co, Fe, and B is used for the magnetization film 110Z. For example, MgO, or the compound of which the main component is MgO is used for the nonmagnetic film 130Z.

The film thickness of the nonmagnetic film 130Z may be greater or smaller than the film thickness of the tunnel barrier layer 120. The magnetic layer 10Z and the magnetization film 110Z may be a single layer film and may be a lamination film (the artificial lattice).

For example, Ru or the like is used for the cap layer 14Z. The hard mask 17B is made from the conductive layer 17B. For example, Ta, or the lamination film including Ta, is used for the conductive layer 17B as the hard mask. Since the hard mask 17B is made from a metal, it is possible to use the hard mask 17B as the upper electrode of the MTJ element.

In this manner, the lamination configuration 1Z for forming the MTJ element is formed on the substrate 79.

Moreover, the shift adjustment layer and the interface layer may be formed in a predetermined position in the lamination configuration 1Z.

After the lamination configuration 1Z is formed, the conductive layer 17B as the hard mask is patterned into a predetermined shape (for example, a shape of a column) by performing photolithography and etching. Here, the conductive layer 17B as the hard mask is patterned in such a manner as to correspond to a pattern (a size) of the storage layer to be formed.

As illustrated in FIG. 5, the cap layer 14, the nonmagnetic layer 130, and the magnetization film 110 are sequentially processed (are patterned) from the mask side, with the patterned conductive layer 17B being used as the mask, for example, by performing anisotropic etching such as ion milling.

The nonmagnetic layer 12Z is used as a stopper, and the layer under the storage layer 11 (in the direction of the substrate 79) is not processed.

Ion beams 900A and 900B for the ion milling are emitted from an oblique direction with respect to the surface of the substrate 79, while rotating the substrate 79 in the direction parallel with the surface of the substrate 79. Moreover, the layers 14, 130, and 110 may be processed by performing reactive ion etching (RIE) and using a gas cluster ion beam (GCIB).

Accordingly, the storage layer 11 including the nonmagnetic layer 130 and the magnetization film 110 is formed.

When the cap layer 14 and the storage layer 11 are processed by using the ion beam, scattered substances with conductivity, resulting from the cap layer 14 and the magnetization layer 11, are attached to the lateral sides of the cap layer 14 and the storage layer 11 in such a manner as to straddle the cap layer 14 and the storage layer 11. Accordingly, the residue (re-attachment substance) that is attached to the lateral side of the storage layer 11, is formed on the lateral sides of the cap layer 14 and the storage layer 11, as the sidewall conductive film 15 that connects between the cap layer 14 and the magnetization film 110.

Moreover, incident angles of the ion beams 900A and 900B with respect to the surface of the substrate 79 are properly adjusted in such a manner that the sidewall conductive film 15 that is made from the re-attachment substance is formed on the lateral sides of the cap layer 14 and the storage layer 11.

As illustrated in FIG. 6, the insulation film is deposited in such a manner as to cover the processed hard mask (the upper electrode) 17B, the cap layer 14, the storage layer 11, and the sidewall conductive film 15. Etching back is performed on the deposited insulation film. Accordingly, the sidewall insulation film 19 is formed on the lateral sides of the cap layer 14 and the storage layer 11. The sidewall insulation film 19 is formed on the sidewall conductive film 15 in such a manner that the sidewall insulation film 19 comes into direct contact with the sidewall conductive film 15. The sidewall insulation film 19 covers up the lateral sides of the cap layer 14 and the storage layer 11 with the sidewall film 15 providing a conductive path in between.

It is preferable that the sidewall insulation film 19, for example, be dense silicon nitride (SiN) or aluminum nitride (AlN) that is formed in a conformal manner by using an atomic layer deposition (ALD) technique.

The etching (the ion milling) is performed on the nonmagnetic layer 12Z, the magnetic layer 10Z and the conductive layer 17Z, in a state where the lateral sides of the cap layer 14 and the storage layer 11 are covered with the sidewall insulation film 19. The upper electrode 17B/cap layer 14 of which the lateral sides are covered with the sidewall insulation film 19, and the storage layer 11 are used as a mask for forming the tunnel barrier layer and the reference layer, each of which has a predetermined shape, and thus the nonmagnetic layer 12Z, the magnetic layer 10Z and the conductive layer 17Z are sequentially processed. Moreover, it is desirable that the film thickness of the sidewall insulation film 19 be adjusted in such a manner that each of the tunnel barrier layer 12 and the reference layer 10 has a predetermined dimension.

Accordingly, as illustrated in FIG. 3, the tunnel barrier layer 12, the reference layer 10 and the lower electrode 17A are formed under the storage layer 11.

At the time of the processing of the magnetic layer 10Z and the conductive layer 17Z under the storage layer 11, the lateral sides of the upper electrode 17B/cap layer 14, and the storage layer 11 are covered with the sidewall insulation film 19. Because of this, the sidewall insulation film 19 prevents the residue (the re-attachment substance) caused by the magnetic layer 10Z and the conductive layer 17Z from being deposited directly on the lateral side of the storage layer 11. Accordingly, the storage layer 11 and the reference layer 10 are prevented from short-circuiting.

The MTJ element 1A according to the present embodiment is formed by using a manufacturing process described above.

In the method of manufacturing the MTJ element according to the present embodiment, the magnetization film 110 in the storage layer 11 is formed in such a manner as to be interposed between the two nonmagnetic films 12 and 130 that make the interface magnetic anisotropy develop.

Accordingly, in each of the upper surface and the lower surface of the magnetization film 110, the interface magnetic anisotropy occurs between the magnetization film 110 and the nonmagnetic layers 12 and 130. As a result, the vertical magnetic anisotropy of the magnetization film 110 between the two nonmagnetic layers 12 and 130 is improved and the thermal stability and the MR ratio of the formed MTJ element 1A are improved.

In the method of manufacturing the MTJ element according to the present embodiment, the sidewall film 15 with conductivity is formed on the lateral sides of the upper electrode 17B/cap layer 14, and the storage layer 11, in such a manner as to provide an electrical connection between the upper electrode 17B/cap layer 14, and the magnetization film 110 in the storage layer 11.

Accordingly, at the time of operation of the MTJ element 1A, the electric current flowing through the MTJ element 1A flows through the sidewall conductive film 15 of low resistance, and then flows between the upper electrode 17B and the magnetization film 110, without flowing through the anisotropy assignment film 130 of high resistance. As a result, in the formed MTJ element 1A, a loss of the electric current caused by the anisotropy assignment film 130 can be suppressed. Furthermore, the deterioration in the MR ratio of the MTJ element 1A caused by the parasitic resistance of the anisotropy assignment film 130 can be suppressed by forming the sidewall conductive film 15 that becomes the electric current path.

In the method of manufacturing the MTJ element according to the present embodiment, the film (the re-attachment substance) formed by the residue that is attached to the lateral sides of the cap layer 14 and the storage layer 11 when the cap layer 14 and the storage layer 11 are processed by using the ion beam, is formed as the sidewall conductive film 15 on the lateral sides of the cap layer 14 and the storage layer 11. In this manner, an extension of the process of manufacturing the MTJ element to form the sidewall conductive film 15 can be prevented by use of the residue caused by the etching (the ion milling) as the sidewall conductive film 15 that connects between the cap layer 14 (the upper electrode 17B) and the storage layer 11 (the magnetization film 110).

As described above, in the method of manufacturing the magnetoresistive effect element according to the first embodiment, the magnetoresistive effect element can be provided of which element characteristics are improved.

B. Second Embodiment

A magnetoresistive effect element according to a second embodiment is described referring to FIG. 7 to FIG. 10. In the magnetoresistive effect element according to the present embodiment, configurations that are substantially the same as the configurations of the magnetoresistive effect element according to the first embodiment are given like reference numerals, and descriptions thereof are provided whenever necessary.

b1. Construction

Figure 7:
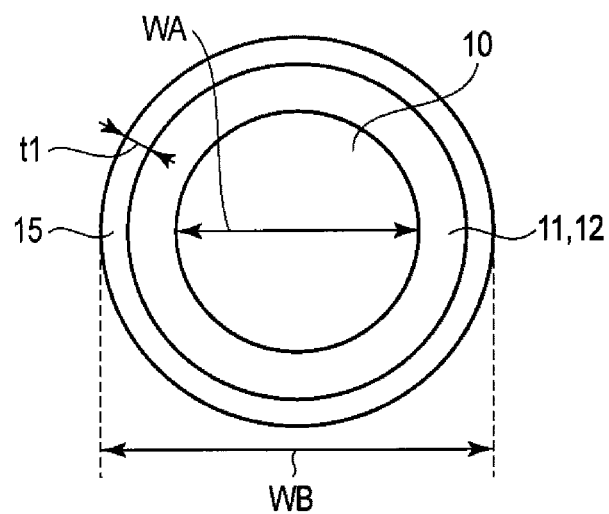
FIG. 7 is a view illustrating a configuration of a magnetoresistive effect element according to a second embodiment.
Figure 8:
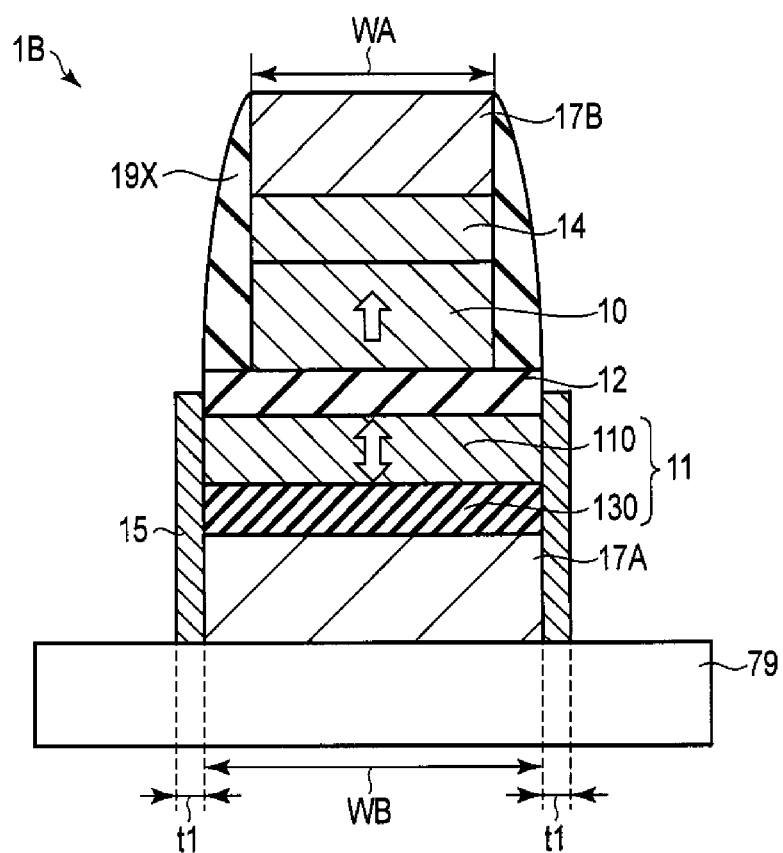
FIG. 8 is a view illustrating the configuration of the magnetoresistive effect element according to the second embodiment.

A configuration of the magnetoresistive effect element according to the second embodiment is described referring to FIG. 7 and FIG. 8.

FIG. 7 illustrates a planar configuration of the magnetoresistive effect element according to the second embodiment, and FIG. 8 illustrates a cross-sectional configuration of the magnetoresistive effect element according to the second embodiment.

As illustrated in FIG. 7 and FIG. 8, a magnetoresistive effect element (an MTJ element) 1B according to the present embodiment has a bottom free type (referred to as a top pin type) configuration.

That is, a reference layer 10 is provided over a storage layer 11 with a tunnel barrier layer 12 being interposed in between. The storage layer 11 is provided on a lower electrode 17A. The lower electrode 17A may include a base layer (not illustrated) for improving crystallinity of the storage layer 11.

As illustrated in FIG. 7 and FIG. 8, a dimension WB of the storage layer 11 in the direction parallel with a surface of a substrate is greater than a dimension WA of the reference layer 10 in the direction parallel with the surface of the substrate.

Furthermore, a dimension of a tunnel barrier layer 12 in the direction parallel with the surface of the substrate is substantially the same as the dimension WB of the storage layer 11, and greater than the dimension WA of the reference layer 10.

A sidewall insulation film 19X is provided on a lateral side of the reference layer 10. The lower surface of the sidewall insulation film 19X comes into contact with the upper surface of the tunnel barrier layer 12. For example, silicon nitride or aluminum nitride is used for the sidewall insulation film 19X.

As in the first embodiment, the storage layer 11 includes an anisotropy assignment film (for example, an MgO film) 130, and a magnetization film (for example, a CoFeB film) 110 is interposed between the tunnel barrier layer 12 and the anisotropy assignment film 130. Accordingly, an interface magnetic anisotropy energy is given to both surfaces of the magnetization film 110 in the direction vertical to the film surface, and vertical magnetic anisotropy of the storage layer 11 is improved.

In addition, a conductive layer (an electric current path film) 15 is provided, as an electric current path, on lateral sides of the storage layer 11 and the lower electrode 17A. The conductive layer 15 connects between the lower electrode 17A and the magnetization film 110 in the storage layer 11. However, because an upper end of the conductive layer 15 may be present on the reference layer rather than on the lower surface of the tunnel barrier layer 12. and it is desirable for the conductive layer 15 to electrically connect between the magnetization layer 110 and the lower electrode 17A, it is preferable that the conductive layer be present on the substrate rather than on the lower surface of the tunnel barrier layer 12 (the upper surface of the storage layer 11). A short circuit between the conductive layer 15 and the reference layer 10 is prevented by the sidewall insulation film 19X covering up the lateral side of the reference layer 11.

In the MTJ element 1B according to the present embodiment, most of the electric current (write electric current and read electric current) supplied to the MTJ element 1B flows through the sidewall conductive film 15 and then flows between the magnetization film 110 and the lower electrode 17A. For that reason, an influence of parasitic resistance is reduced that is caused by the anisotropy assignment film 130 of high resistance that is provided in the storage layer 11.

As a result, in the MTJ element 1B according to the embodiment, improvements in magnetic anisotropy and thermal stability of the magnetic layer 11, caused by the anisotropy assignment film 130, is obtained without an adverse effect of the anisotropy assignment film 130.

Therefore, the magnetoresistive effect element according to the second embodiment obtains the same effect as the magnetoresistive effect element according to the first embodiment.

b2. Manufacturing Method

Figure 9:
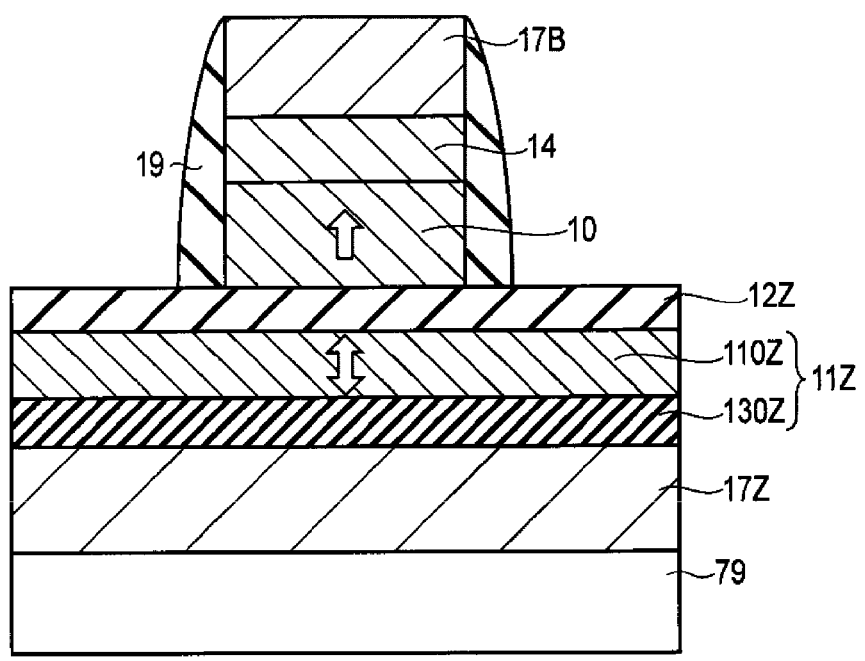
FIG. 9 is a cross-sectional view illustrating a method of manufacturing the magnetoresistive effect element according to the second embodiment.
Figure 10:
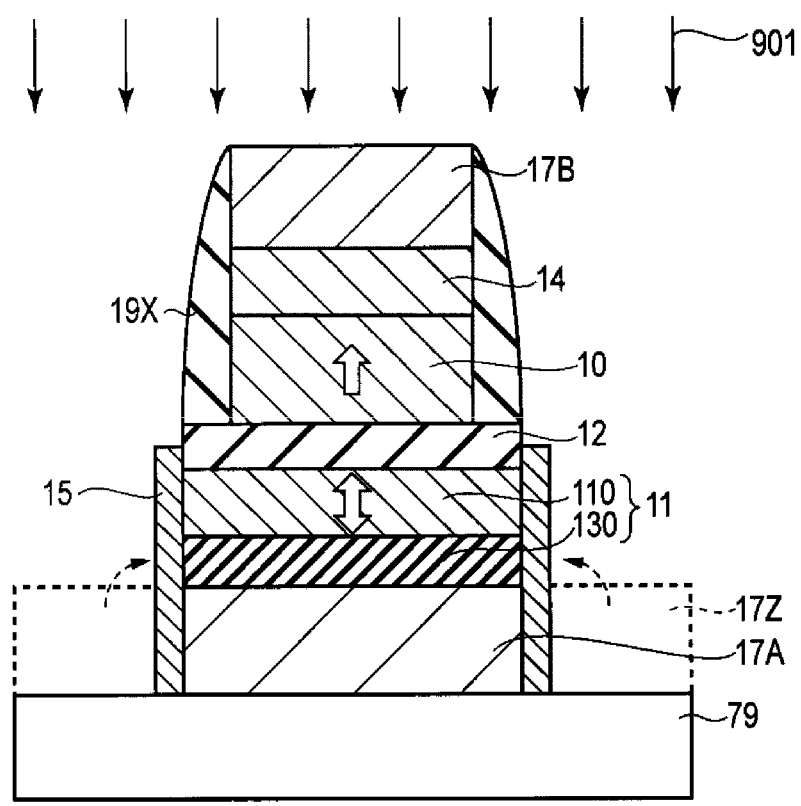
FIG. 10 is a cross-sectional view illustrating the method of manufacturing the magnetoresistive effect element according to the second embodiment.

A method of manufacturing the magnetoresistive effect element according to the second element is described referring to FIG. 9 and FIG. 10. Moreover, when a manufacturing process according to the present embodiment is substantially the same as the manufacturing process described according to the first embodiment, descriptions thereof are omitted.

FIG. 9 and FIG. 10 are cross-sectional views, each illustrating each process of the method of manufacturing the magnetoresistive effect element according to the second embodiment.

As illustrated in FIG. 9, constituent members of the magnetoresistive effect element (the MTJ element) are deposited sequentially on a substrate 79.

According to the present embodiment, a material that becomes a storage layer 11Z is formed on a conductive layer 17Z that becomes the lower electrode. A nonmagnetic film (for example, MgO) 130Z as the anisotropy assignment film is deposited on the conductive layer 17Z. A magnetization film (for example, CoFeB) 110Z is deposited on the nonmagnetic layer 130Z. A nonmagnetic layer (for example, MgO) 12Z that becomes the tunnel barrier layer is deposited on the magnetization film 110Z.

For example, crystallinity of the anisotropy assignment film 130Z and crystallinity of the magnetization film 11Z can be improved by making the conductive layer 17Z include a base layer that has a small lattice mismatch with respect to the anisotropy assignment film 130Z, in the direction of the upper surface of the conductive layer 17Z (in the direction of contact with the anisotropy assignment film).

A magnetic layer 10 that becomes the reference layer, a cap layer 14, and a hard mask 17B are sequentially deposited on the nonmagnetic layer 12Z on the magnetization film 110Z.

Then, the cap layer 14 and the reference layer 10 are processed into a predetermined shape by using the nonmagnetic layer 12Z as a stopper of the etching, based on the patterned hard mask 17B.

After processing the reference layer 10, but before processing the nonmagnetic layer 12Z, for example, a sidewall insulation film 19X is formed on lateral sides of the reference layer 10, the cap layer 14 and the hard mask (the upper electrode) 17B by using a CVD technique and performing the etching back.

As illustrated in FIG. 10, the sidewall insulation film 19X and the hard mask 17B are used as the mask, and thus the exposed nonmagnetic layer 12 and the layers 110, 130, and 17A, which are under the exposed nonmagnetic layer 12, are etched by an ion beam 901. The etching of the members under the nonmagnetic layer 12Z may be performed by emitting the ion beam 901 from the oblique direction with respect to the surface of the substrate, or may be performed by emitting the ion beam 901 from the vertical direction with respect to the surface of the substrate.

As illustrated in FIG. 10, the tunnel barrier layer 12, the storage layer 11 and the lower electrode 17A are formed by the etching. The storage layer 11 on the lower electrode 17A includes the magnetization film 110 and the anisotropy assignment film 130.

For example, at the time of the processing of the lower electrode 17A, the conductive material that makes up the lower electrode 17A is formed on the lateral sides of the magnetization film 110 and the lower electrode 17A, in such a manner that the conductive material is scattered by sputtering the lower electrode 17A with the ion beam 901, and the scattered conductive material, as the re-attachment substance 15, straddles the lateral side of the anisotropy assignment film 130.

Accordingly, the conductive layer (the electric current path film) 15 that electrically connects between the magnetization film 110 of the storage layer 11 and the lower electrode 17A is formed on the lateral sides of the storage layer 11 and the lower electrode 17A.

At the time of the processing of the lower electrode 17A, the lateral sides of the reference layer 10 and the upper electrode 17B that are over the tunnel barrier layer 12 are covered with a sidewall insulation film 19. Because of this, the re-attachment substance with conductivity resulting from the lower electrode 17A is not attached directly to the lateral sides of the reference layer 10 and the upper electrode 17B. For that reason, the short circuit between the reference layer 10 and the storage layer 11 does not occur due to the re-attachment substance resulting from the lower electrode 17A.

Thereafter, by using the same process as the process according to the first embodiment, a protective film covering the MTJ element, an interlayer insulation film, and the like are sequentially formed and the MTJ element according to the second embodiment is formed.

As described above, in the method of manufacturing the MTJ element according to the present embodiment, the bottom free type MTJ element 1B illustrated in FIG. 7 and FIG. 8 is formed.

In the method of manufacturing the MTJ element according to the present embodiment, the magnetization film 110 in the storage layer 11 is formed in such a manner as to be interposed between the tunnel barrier layer 12 and the anisotropy assignment film 130.

In the storage layer 11 of the bottom free type MTJ element, the conductive layer 15 that straddles the lateral side of the anisotropy assignment film 130 and thus causes conduction to take place between the magnetization film 110 and the lower electrode 17A because of the re-attachment substance generated at the time of the etching of the lower electrode 17A is formed on the lateral sides of the storage layer 11 and the lower electrode 17A.

According to the present embodiment, since the sidewall conductive film 15 is formed from the re-attachment substance generated at the time of the processing of the lower electrode 17A, the process of manufacturing the MTJ element is not extended.

The MTJ element 1B according to the second embodiment, which is formed by the manufacturing method described above, in the same manner as according to the first embodiment can improve the thermal stability of the MTJ element 1B by improving the interface magnetic anisotropy of the storage layer 11 through the use of the anisotropy assignment film 130, and can suppress the loss of the electric current supplied to the MTJ element 1B, caused by the anisotropy assignment film 130, through the use of the sidewall conductive film (the electric current path film) 15.

As described above, the magnetoresistive effect element according to the second embodiment, and the method of manufacturing the magnetoresistive effect element can improve element characteristics in the same manner as according to the first embodiment.

C. Modification Example

Modification examples of the magnetoresistive effect element according to the embodiment and the method of manufacturing the magnetoresistive effect element are described referring to FIG. 11 to FIG. 14. Moreover, according to the present modification example, constituent elements, functions, and processes described according to the first and second embodiments, and the substantially same things as them are described whenever necessary.

C1. Modification Example 1

Figure 11:
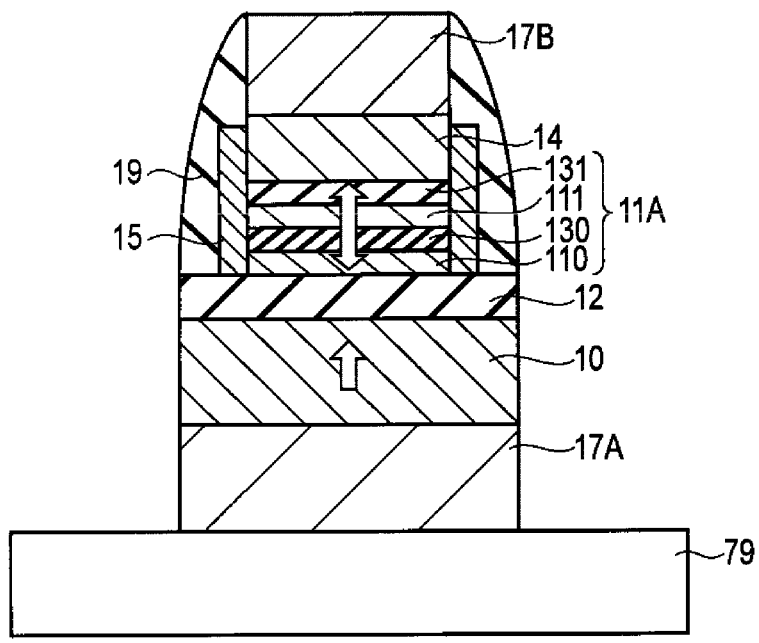
FIG. 11 is a view illustrating a modification example of the magnetoresistive effect element according to the embodiment.

One example of the modification example of the magnetoresistive effect element according to the embodiment is described referring to FIG. 11.

FIG. 11 illustrates a cross-sectional configuration of the modification example of the magnetoresistive effect element according to the embodiment.

As illustrated in FIG. 11, a storage layer 11 of an MTJ element may include multiple anisotropy assignment films 130 and 131.

A storage layer 11A of the MTJ element in FIG. 11 has a lamination configuration in which multiple magnetization films 110 and 111 and the multiple anisotropy assignment films 130 and 131 are alternately laminated.

Accordingly, vertical magnetic anisotropy of the storage layer 11A that is caused by interface magnetic anisotropy can be improved.

A conductive layer 15 as an electric current path is provided on lateral sides of the multiple magnetization films 110 and 111 in a storage layer 11 and a cap layer 14 (or, an electrode 17B), in such a manner as to straddle the multiple anisotropy assignment films 130 and 131 in the storage layer 11.

For that reason, even though the storage layer 11 includes the multiple anisotropy assignment films 130 and 131, an influence of parasitic resistance caused by the anisotropy assignment films 130 and 131 of high resistance can be reduced by the conductive layer 15 that connects between the magnetization film in the storage layer 11A and the cap layer 14 (the electrode 17B).

Moreover, in FIG. 11, a top free type MTJ element is illustrated, but a storage layer of a bottom free type MTJ element may have the configuration in which the magnetization film and the anisotropy assignment film are laminated.

C2. Modification Example 2

Figure 12:
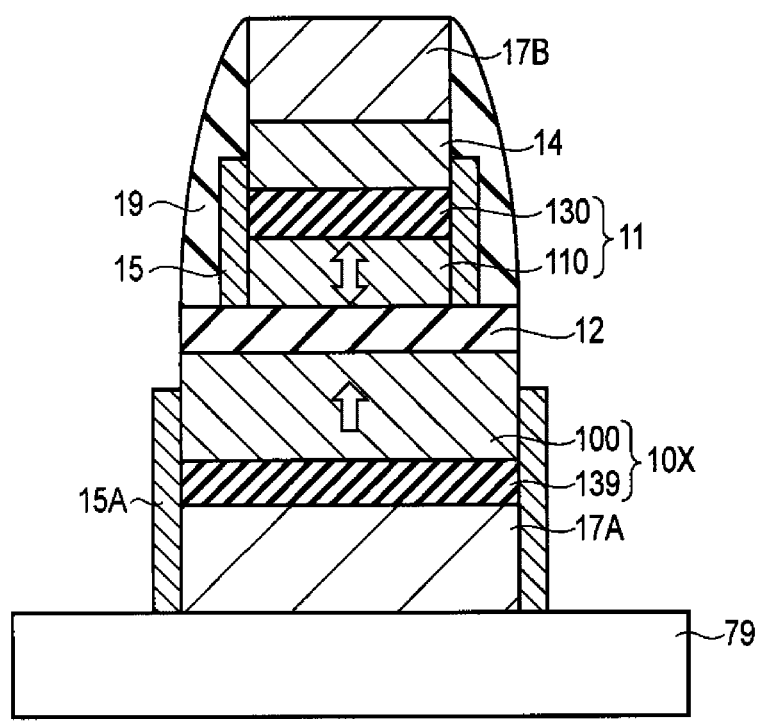
FIG. 12 is a view illustrating a modification example of the magnetoresistive effect element according to the embodiment.

A modification example of the magnetoresistive effect element according to the embodiment is described referring to FIG. 12.

FIG. 12 illustrates a cross-sectional configuration of the modification example of the magnetoresistive effect element according to the embodiment.

As illustrated in FIG. 12, an anisotropy assignment film 139 may be provided with respect to a reference layer 10X.

In this case, the reference layer 10X includes a magnetization film 100 and an anisotropy assignment film 139.

The magnetization film 100 in the reference layer 10X has vertical magnetization anisotropy with respect to a film surface, caused by development of interface magnetic anisotropy. The magnetization film 100 in the reference layer 10X is interposed between a tunnel barrier layer 12 and an anisotropy assignment film 139. Accordingly, the vertical magnetic anisotropy of the magnetization film 100 is improved.

Then, a conductive layer 15A is provided on lateral sides of a reference layer and a base layer (a lower electrode), in such a manner as to straddle a lateral side of the anisotropy assignment film 139 in the reference layer 10.

Accordingly, if the magnetization film 100 in the reference layer 10 is a magnetic layer that causes the interface magnetic anisotropy to develop the vertical magnetic anisotropy, the vertical magnetic anisotropy of the magnetization film 100 in the reference layer 10X is improved by the anisotropy assignment film 139. Because a film thickness (a volume) of the magnetization film 100 is increased to increase a magnetization reversal threshold value, an influence of the anisotropy assignment film 139 on an improvement in the magnetic anisotropy of the magnetization film 100 is great in the reference layer 10X.

Moreover, in FIG. 12, the example in which the anisotropy assignment films 130 and 139 are provided on both of the reference layer 10 and the storage layer 11 is illustrated, but the anisotropy assignment film may not be provided on the storage layer 11 and may be provided only in the reference layer 10.

Furthermore, a configuration in which the reference layer 10X of a top free type MTJ element includes the anisotropy assignment film is illustrated in FIG. 12, but the reference layer of the bottom free type MTJ element, as illustrated in FIG. 8, may include the anisotropy assignment film.

C3. Modification Example 3

Figure 13:
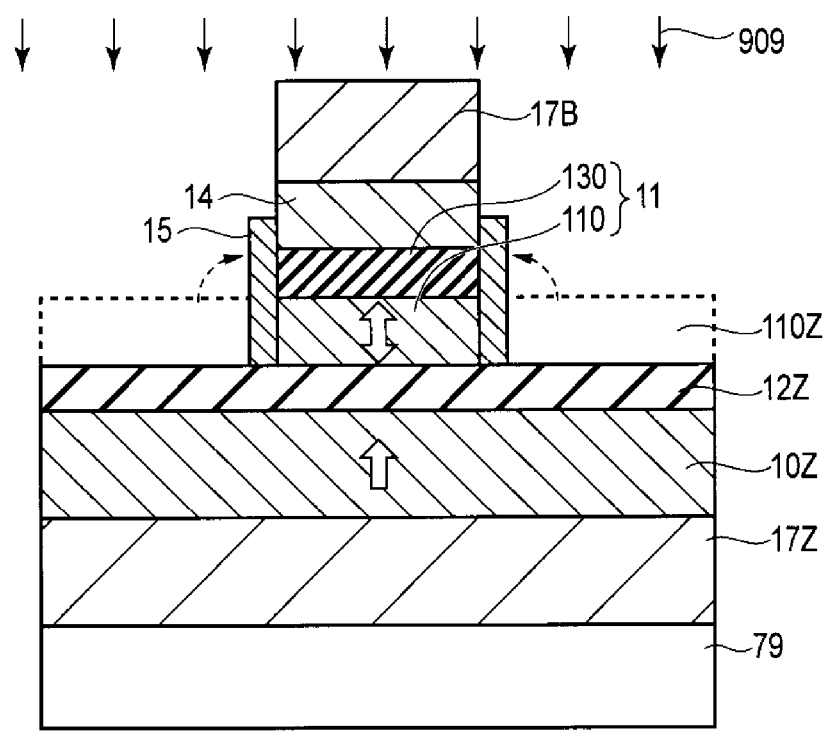
FIG. 13 is a view illustrating a modification example of the magnetoresistive effect element according to the embodiment.

A modification example of the method of manufacturing the magnetoresistive effect element according to the embodiment is described referring to FIG. 13. FIG. 13 is a cross-sectional process view illustrating one process of the modification example of the method of manufacturing the magnetoresistive effect element according to the embodiment.

If an emission direction of an ion beam with respect to a lamination configuration (a processed layer) for processing an MTJ element is caused to be oblique with respect to a surface of a substrate, the ion beam is emitted not only to the upper surface of the processed layer, but also to a lateral side of the processed layer. Oblique ion beam etching can again attach a scattered substance of the etched member onto the lateral side of the processed layer and can remove the substance, re-attached to the processed layer, from the lateral side thereof. For that reason, if the magnetoresistive effect element is processed with the oblique ion beam etching, an amount of substance attached to the lateral side of the processed layer is reduced depending on a size of an incident angle of the ion beam on the substrate.

Depending on a state in which the incident angle of the ion beam is in the direction vertical to the surface of the substrate, an amount of the etched lateral side of the processed layer is decreased and the amount of substance that is attached to (resides on) the lateral side of the processed layer is increased.

As illustrated in FIG. 13, if a conductive layer (an electric current path film) is formed on a lateral side of a storage layer by using a re-attachment substance from the processed layer with conductivity, a member (a magnetic layer or an electrode) for forming the conductive layer may be etched by using an ion beam 909 that is emitted from the direction vertical to the surface of the substrate. Accordingly, an amount of the re-attachment substance is increased that is deposited on the lateral side of the storage layer including an anisotropy assignment film.

Accordingly, a conductive layer 15 can be very efficiently formed that connects a magnetization film 110 in a storage layer 11 and an electrode (a cap layer) by straddling a lateral side of an anisotropy assignment film 130.

As a result, a film thickness of the conductive layer 15 as the electric current path can be great and a resistance value of the conductive layer 15 as the electric current path can be reduced.

Therefore, electric current flowing between the storage layer 11 and an electrode 17B can be increased in amount.

C4. Modification Example 4

Figure 14:
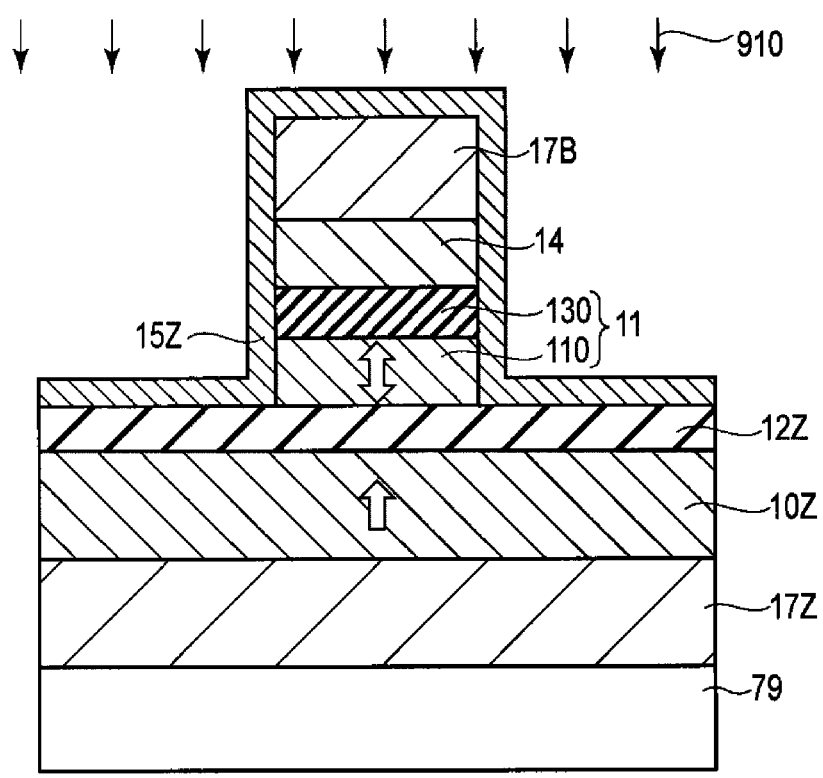
FIG. 14 is a view illustrating a modification example of the magnetoresistive effect element according to the embodiment.

A modification example of the method of manufacturing the magnetoresistive effect element according to the embodiment is described referring to FIG. 14. FIG. 14 is a cross-sectional process view illustrating one process of the modification example of the method of manufacturing the magnetoresistive effect element according to the embodiment.

Each of the examples described above illustrates that a sidewall conductive film (an electric current path film) is formed on lateral sides of a storage layer and an electrode by using a re-attachment substance with conductivity.

However, the conductive layer may be formed that connects between a magnetization film in the storage layer and the electrode (and the cap layer) by bridging an anisotropy assignment film by depositing and processing the conductive layer.

For example, as illustrated in FIG. 14, the storage layer 11 having a predetermined shape is formed with a tunnel barrier layer 12Z as a stopper.

Thereafter, a conductive layer 15Z for forming the sidewall conductive film is deposited by using a sputter technique, in such a manner as to cover the processed storage layer 11 and a hard mask/cap layer 17B, and 14. Accordingly, the conductive layer 15Z is deposited on lateral sides of the hard mask 17B and the cap layer 14, on a lateral side of an anisotropy assignment film 130, and on a lateral side of a magnetization film 110. Furthermore, the conductive layer 15Z is deposited on the upper surface of the hard mask 17B and on the upper surface of the tunnel barrier layer 12Z.

For example, one of Co, Fe, Ta, Ti, TaN, TiN and a lamination layer that is configured from these is used for the conductive layer 15Z.

For example, an ion beam 910 is emitted to the conductive layer 15Z, and the deposited conductive layer 15Z is etched back in such a manner that the conductive layer 15Z remains on the lateral sides of the storage layer 11, the hard mask/cap layer (the conductive layer) 14, and 17B in a self-aligning manner.

Accordingly, the sidewall conductive film (the electric current path film) that connects an anisotropy assignment film 130 in the storage layer 11 and the conductive layers 14 and 17B by straddling a lateral side of the anisotropy assignment film 130 is formed on the lateral sides of the storages layers 11 and the conductive layers 14 and 17B.

In this manner, a sidewall conductive film 15, uniform in film quality, can be formed by forming the sidewall conductive film 15 through the use of a film deposition technology. Furthermore, if the sidewall conductive film 15 is formed through the use of the film deposition technology, a film thickness of the sidewall conductive film 15 is easy to control, compared to the sidewall conductive film that is formed by using the re-attachment substance. As a result, a resistance value of the sidewall conductive film 15 can be reduced, and electric current can flow more efficiently between the conductive layers (the cap layer and the electrode) 14 and 17B and the magnetization film (the storage layer) 110.

Moreover, the sidewall conductive film 15 for connecting between the magnetization film 110 and the conductive layer 14 that interpose the anisotropy assignment film 130 between them, and the conductive layer 17B may be a lamination layer that is configured from the conductive layer made from the re-attachment substance and the conductive layer that is deposited separately from the re-attachment substance.

As described above, in the magnetoresistive effect element according to the modification example of the embodiment that is described referring to FIG. 11 to FIG. 14, the same effect as according to the first and second embodiment can be obtained, and device characteristics of the magnetoresistive effect element can be improved.

4. Application Example

Figure 15:
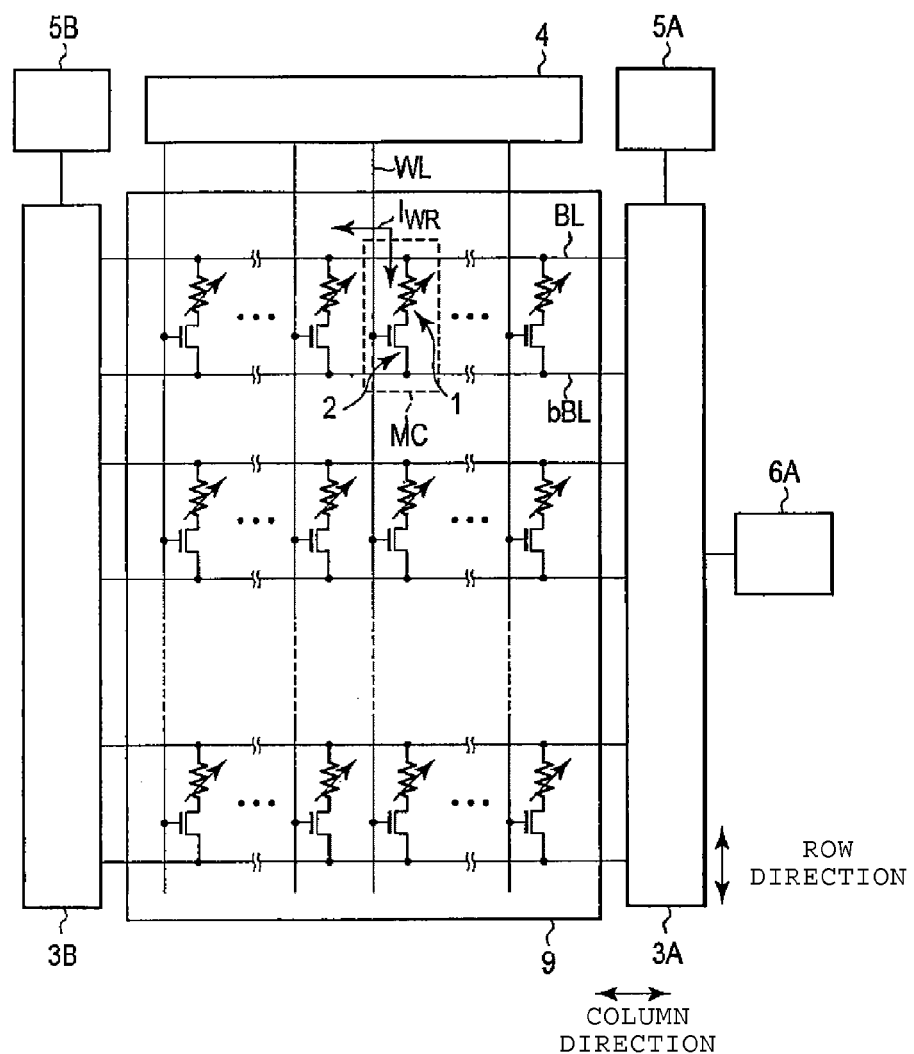
FIG. 15 is a view illustrating an application example of the magnetoresistive effect element according to the embodiment.
Figure 16:
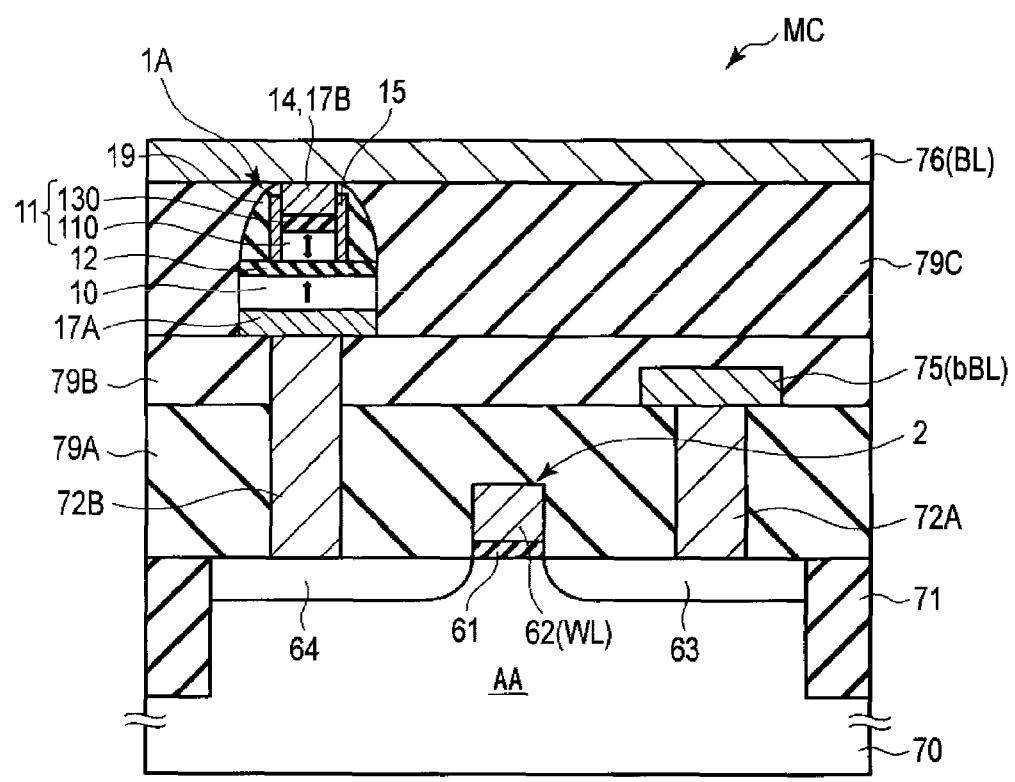
FIG. 16 is a view illustrating an application example of the magnetoresistive effect element according to the embodiment.

An application example of the magnetoresistive effect element according to the embodiment is described referring to FIG. 15 and FIG. 16. Moreover, a configuration that is substantially the same as the configuration described above according to the embodiment is given like reference numerals and a description of that configuration is provided whenever necessary.

The magnetoresistive effect element described above according to the embodiment is used as a memory element of magnetic memory, for example, magnetoresistive random access memory (MRAM). In the present application example, spin-torque transfer MRAM (STT MRAM) is exemplified.

FIG. 15 is a view illustrating a memory cell array of MRAM according to the present application example and a configuration of a circuit in the vicinity thereof.

As illustrated in FIG. 15, a memory cell array 9 includes multiple memory cells MC.

The multiple memory cells MC are arranged in an array within the memory cell array 9. In memory cell array 9, multiple bit lines BL and bBL and multiple word lines WL are provided. The bit lines BL and bBL extend in the column direction, and the word lines WL extend in the row direction. The two bit lines BL and bBL form one set, a pair of bit lines.

The memory cells MC are connected to the bit lines BL and bBL and the word lines WL.

The multiple memory cells MC arranged in the column direction are connected to the pair of common bit lines BL and bBL. The multiple memory cells MC arranged in the row direction are connected to the common word lines WL.

The memory cell MC, for example, includes one magnetoresistive effect element (an MTJ element) 1 as a memory element and one selection switch 2. The magnetoresistive effect element (the MTJ element) 1 described according to the first or second embodiment (or the modification example) is used for the MTJ element 1 within the memory cell MC.

The selection switch 2, for example, is a field effect transistor. The field effect transistor as the selection switch 2 is hereinafter referred to as the selection transistor 2.

One end of the MTJ element 1 is connected to the bit line BL, and the other end of the MTJ element 1 is connected to one end (source/drain) of an electric current path of the selection transistor 2. The other end (drain/source) of the electric current path of the selection transistor 2 is connected to the bit line bBL. A control terminal (a gate) of the selection transistor 2 is connected to the word line WL.

One end of the word line WL is connected to a row control circuit 4. The row control circuit 4 controls activation/deactivation of the word line WL, based on an address signal from the outside.

Column control circuits 3A and 3B are connected to one end and the other end of the bit lines BL and bBL. The column control circuits 3A and 3B control activation/deactivation of the bit lines BL and bBL, based on the address signal from the outside.

Write circuits 5A and 5B are connected to one end and the other end of the bit lines BL and bBL, via the column control circuits 3A and 3B, respectively. The write circuits 5A and 5B each have a source circuit such as an electric current source or a voltage source for generating write electric current $I_{WR}$, and a sink circuit for absorbing the write electric current $I_{WR}$.

In STT MRAM, the write circuits 5A and 5B each supply the write electric current to the memory cell (hereinafter referred to as the selection cell) selected by the outside at the time of data writing.

In the write circuits 5A and 5B, at the time of the data writing to the MTJ element 1, the write electric current flows through the MTJ element 1 within the memory cell MC in the two-way direction, depending on data written to the selection cell. That is, the write electric current $I_{WR}$ that is to flow from the bit line BL to the bit line bBL, or the write electric current $I_{WR}$ that is to flow from the bit line bBL to the bit line BL is output from the write circuits 5A and 5B, depending on the write data to the MTJ element 1.

A read circuit 6A is connected to one end of the bit lines BL and bBL via the column control circuits 3A and 3B. The read circuit 6A includes the voltage source or the electric current source for generating the read electric current, a sense amplifier that performs detection and amplification of a read signal, a latch circuit that temporarily holds the data, and the like. At the time of the data reading from the MTJ element 1, the read circuit 6A supplies the read electric current to the selection cell. An electric current value of the read electric current is smaller than an electric current value (a magnetization reversal threshold value) of the write electric current $I_{WR}$ in such a manner that magnetization of a recording layer is not reversed by the read electric current.

The electric current value or electric potential in a read node varies depending on a resistance value level of the MTJ element 1 to which the read electric current is supplied. The data stored in the MTJ element 1 is discriminated based on an amount of change (a read signal and a read output) that depends on the resistance value level.

Moreover, in the example illustrated in FIG. 15, the read circuit 6A is provided on one end of the memory cell 9, which faces in the column direction, but the two read circuits may be provided on one end and the other end of the memory cell array 9, which face in the column direction, respectively.

For example, a buffer circuit, a state machine (a control circuit), an error checking and correcting (ECC) circuit, or the like, for example, may be provided in the same chip as the memory cell array 9.

FIG. 16 is a cross-sectional view illustrating one example of a configuration of the memory cell MC that is provided within the memory cell array 9 of MRAM according to the present application example.

The memory cell MC is formed within an active region AA of a semiconductor substrate 70. The active region AA is partitioned by an insulation film 71 buried in an element isolation region of the semiconductor substrate 70.

Multiple interlayer insulation films 79A, 79B, and 79C are laminated on the semiconductor substrate 70. An MTJ element 1A is provided in the interlayer insulation film 79C.

The upper end of the MTJ element 1A is connected to a bit line 76 (BL) via an upper electrode 17B. Furthermore, the lower end of the MTJ element 1A is connected to a source/drain diffusion layer 64 of the selection transistor 2, via a lower electrode 17A, and a contact plug 72B buried in the interlayer insulation film 79A. A source/drain diffusion layer 63 of the selection transistor 2 is connected to a bit line 75 (bBL) via a contact plug 72A.

A gate electrode 62 is formed on the surface of an active region AA between a source/drain diffusion layer 64 and a source/drain diffusion layer 63 via a gate insulation film 61. A gate electrode 62 extends in the row direction and is used as the word line WL.

Moreover, the MTJ element 1A is provided directly over the plug 72B, but may be arranged in a position that deviates from directly over the contact plug (for example, over the gate electrode of the selection transistor), by using an intermediate wiring layer.

In FIG. 16, an example is illustrated in which one memory cell is provided within the one active region AA. However, the two memory cells, adjacent to each other in the column direction, may be provided within the one active region AA, in such a manner that the two memory cells share the one bit line bBL and the source/drain diffusion layer 63. Accordingly, the memory cell MC is decreased in size.

In FIG. 16, a field effect transistor having a planar configuration is illustrated as the selection transistor 2. However, the configuration of the selection transistor is not limited to this. For example, the field effect transistor having a three-dimensional construction, such as a recess channel array transistor (RCAT), or a FinFET may be used as the selection transistor. The RCAT has a configuration in which the gate electrode is buried in a groove (a recess) within the semiconductor region, via a gate insulation film. The FinFET has a configuration in which the gate electrode is made to three-dimensionally intersect the rectangular-shaped semiconductor region (fin), via the gate insulation film.

As illustrated in FIG. 16, a storage layer 11 of the MTJ element 1A includes a magnetization layer 110 and an anisotropy assignment film 130. Accordingly, the magnetization film 110 in the storage layer 11 is interposed between the anisotropy assignment film 130 and a tunnel barrier layer 12, and on both surfaces of the magnetization film 110, one surface facing toward the tunnel barrier layer 12 and the other surface facing toward the anisotropy assignment film 139, an interface magnetic anisotropy develops with respect to the magnetization film 110. Because of this, vertical magnetic anisotropy of the storage layer 11 (the magnetization film 110) is improved, and thermal stability and an MR ratio of the MTJ element 1A are improved.

Furthermore, in the MTJ element 1A, a sidewall conductive film (an electric current path film) 15 is provided on a lateral side of the magnetization film 110 and on a lateral side of the upper electrode 17B including a cap layer 14, in such a manner as to straddle a lateral side of the anisotropy assignment film 130. Accordingly, conduction takes place directly between the magnetization film 110 and the upper electrodes 14 and 17B, and an electric current path that does not include the anisotropy assignment film 130 is formed between the magnetization layer 110 and the upper electrodes 14 and 17B that are in the MTJ element 1A.

For this reason, the loss of an electric current caused by anisotropy assignment film 130 is suppressed even if the anisotropy assignment film 130 is provided within the MTJ element 1A for vertical magnetic anisotropic improvement of magnetization film 110 as storage layer 11. As a result, when the MRAM including the MTJ element 1A according to the present embodiment operates, an increase in the write electric current and the read electric current supplied to the MTJ element 1A can be suppressed.

Furthermore, with the sidewall conductive film 15 as the electric current path, parasitic resistance that occurs in the storage layer 11, caused by the anisotropy assignment film 130, can be substantially ignored, and a decrease in the MR ratio of the MTJ element 1A, caused by the parasitic resistance thereof, can be suppressed. As a result, reliability of the data reading in the MRAM is improved.

Moreover, in FIG. 16, the example is illustrated in which the MTJ element 1A according to the first embodiment is used for the memory cell MC, but the MTJ element illustrated according to the second embodiment or the modification example may be used for the memory MC.

As described above, the MRAM (the magnetic memory) that uses the magnetoresistive effect element according to the present embodiment can improve operational characteristics thereof and can suppress an increase in electric power consumption.

Others

The magnetoresistive effect element, described above, according to each embodiment, may be applied to magnetic memory other than the MRAM. The magnetic memory that uses the magnetoresistive effect element described according to the embodiment, for example, is used as a substitute memory for DRAM, SRAM, and the like.

For example, the magnetic memory (for example, STT-MRAM) that uses the magnetoresistive effect element according to the present embodiment can be applied as a cache memory of a storage device such as a solid state drive (SDD) or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
    first and second conductive layers;
    a first magnetic layer between the first and second conductive layers having a magnetization direction that is unchangeable;
    a second magnetic layer between the first and second conductive layers having a magnetization direction that is changeable;
    a tunnel barrier layer between the first and second magnetic layers;
    a nonmagnetic layer between the second magnetic layer and the second conductive layer; and
    a conductive sidewall film that provides a current path between the second magnetic layer and the second conductive layer, the conductive sidewall film having a lower resistance than a current path through the nonmagnetic layer, wherein the tunnel barrier layer is laminated on the first magnetic layer and the conductive sidewall film extends from an upper surface of the tunnel barrier layer to a side of the second conductive layer.

2. The magnetoresistive effect element of claim 1, further comprising an insulating sidewall film formed on sides of the conductive sidewall film and the second conductive layer.

3. The magnetoresistive effect element of claim 2, wherein each of the layers have substantially circular planar surfaces and a diameter of the first magnetic layer is equal to a diameter of the tunnel barrier layer and larger than a diameter of the second magnetic layer.

4. The magnetoresistive effect element of claim 1, wherein the tunnel barrier layer and the nonmagnetic layer each include magnesium oxide as a main component, and the conductive sidewall film and the second magnetic layer each include a composition containing a first element.

5. A magnetoresistive effect element comprising:
    first and second conductive layers;
    a first magnetic layer between the first and second conductive layers having a magnetization direction that is unchangeable;
    a second magnetic layer between the first and second conductive layers having a magnetization direction that is changeable;
    a tunnel barrier layer between the first and second magnetic layers;
    a nonmagnetic layer between the second magnetic layer and the second conductive layer; and
    a conductive sidewall film that provides a current path between the second magnetic layer and the second conductive layer, the conductive sidewall film having a lower resistance than a current path through the nonmagnetic layer, wherein the first magnetic layer is laminated on the tunnel barrier layer and the conductive sidewall film extends from an upper surface of the tunnel barrier layer to a side of the second conductive layer.

6. The magnetoresistive effect element of claim 5, further comprising an insulating sidewall film formed on sides of the first magnetic layer and the first conductive layer.

7. The magnetoresistive effect element of claim 6, wherein each of the layers have substantially circular planar surfaces and a diameter of the second magnetic layer is equal to a diameter of the tunnel barrier layer and larger than a diameter of the first magnetic layer.

8. A magnetoresistive effect element comprising:
    first and second conductive layers;
    a first magnetic layer between the first and second conductive layers having a magnetization direction that is unchangeable;

a second magnetic layer between the first and second conductive layers having a magnetization direction that is changeable;

a tunnel barrier layer between the first and second magnetic layers;

a nonmagnetic layer between the second magnetic layer and the second conductive layer;

a conductive sidewall film that provides a current path between the second magnetic layer and the second conductive layer, the conductive sidewall film having a lower resistance than a current path through the nonmagnetic layer; and a third magnetic layer laminated on the nonmagnetic layer and an another nonmagnetic layer laminated on the third magnetic layer, wherein the conductive sidewall film extends from an upper surface of the tunnel barrier layer to a side of the second conductive layer.

* * * * *